(12) United States Patent
Rooyackers et al.

(10) Patent No.: US 7,737,008 B2
(45) Date of Patent: Jun. 15, 2010

(54) METHOD FOR MAKING QUANTUM DOTS

(75) Inventors: Rita Rooyackers, Kessel-lo (BE); Frederik Leys, Gentbrugge (BE); Axel Nackaerts, Haasrode (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/262,041

(22) Filed: Oct. 30, 2008

(65) Prior Publication Data

US 2009/0137102 A1 May 28, 2009

(30) Foreign Application Priority Data

Nov. 1, 2007 (EP) ................... 07075948

(51) Int. Cl.
*H01L 21/20* (2006.01)
*H01L 21/36* (2006.01)

(52) U.S. Cl. ...................... 438/479; 438/962

(58) Field of Classification Search ............... 438/479, 438/962; 977/888, 900
See application file for complete search history.

(56) References Cited

U.S. PATENT DOCUMENTS

| | | | |
|---|---|---|---|
| 6,194,237 B1 * | 2/2001 | Kim et al. .................. 438/22 |
| 6,375,737 B2 * | 4/2002 | Shih et al. .................. 117/3 |
| 7,307,030 B2 * | 12/2007 | Song et al. .................. 438/142 |
| 2005/0136655 A1 | 6/2005 | Wasshuber et al. |
| 2006/0145136 A1 * | 7/2006 | Verhoeven .................. 257/14 |

FOREIGN PATENT DOCUMENTS

WO   WO 03 083949 A1   9/2003

OTHER PUBLICATIONS

Partial European Search Report dated Jul. 2, 2008 for Application No. EP 07075948.5.

* cited by examiner

*Primary Examiner*—Charles D Garber
*Assistant Examiner*—Bryan R Junge
(74) *Attorney, Agent, or Firm*—Knobbe Martens Olson & Bear LLP

(57) ABSTRACT

A method for forming at least one quantum dot at at least one predetermined location on a substrate is disclosed. In one aspect, the method comprises providing a layer of semiconductor material on an insulating layer on the substrate. The layer of semiconductor material is patterned so as to provide at least one line of semiconductor material having a width ($w_L$) and having a local width variation at at least one predetermined location where the at least one quantum dot has to be formed. The local width variation has an amplitude (A) of between about 20 nm and 35 nm higher than the width $w_L$ of the at least one line. The at least one line is patterned to form at least one quantum dot. A design for a lithographic mask for use with the method and a method for making such a design are also disclosed.

13 Claims, 4 Drawing Sheets

METHOD FOR MAKING QUANTUM DOTS

BACKGROUND OF THE INVENTION

1. Field of the Invention

The present invention relates to quantum dots. More particularly, the present invention relates to a method for forming at least one quantum dot at a predetermined location on a substrate, to a design for a lithographic mask for use with this method according to embodiments of the invention and to a method for making such a design as well as to semiconductor devices made with the at least one quantum dot.

2. Description of the Related Technology

Quantum dots are semiconductor nanostructures that confine the motion of conduction band electrons, valence band holes, or excitons (bound pairs of conduction band electrons and valence band holes) in all three spatial directions. Confinement can be due to electrostatic potentials (generated by external electrodes, doping, strain, impurities), the presence of an interface between different semiconductor materials (e.g. in core-shell nano-crystal systems), the presence of the semiconductor surface (e.g. semiconductor nano-crystal), or a combination of these.

Quantum dots have a discrete quantized energy spectrum. The corresponding wave functions are spatially localized within the quantum dot, but extend over many periods of the crystal lattice. Quantum dots contain a small finite number in the order of about 1-100 of elementary electric charges, i.e. a finite number of conduction band electrons, valence band holes, or excitons. The usefulness of quantum dots comes from their peak emission frequency's extreme sensitivity to both the dot's size and composition. This remarkable sensitivity is quantum mechanical in nature. Quantum dots offer the unnatural ability to tune the bandgap and hence the emission wavelength.

Electrons in quantum dots have a range of energies. The concepts of energy levels, bandgap, conduction band and valence band which apply to bulk semiconductors also apply to quantum dots. However, there is a major difference. Excitons have an average physical separation between the electron and hole, referred to as the exciton Bohr radius. This is a physical distance which is different for each material. The dimensions of semiconductor crystals are much larger in bulk semiconductors than the exciton Bohr radius, allowing the exciton to extend to its natural limit. When the size (diameter) of a semiconductor crystal becomes small enough that it approaches the size of the material's exciton Bohr radius, then the electron energy levels can no longer be treated as continuous. In this case, the electron energy levels must be treated as discrete. This means that there is a small and finite separation between energy levels. This situation of discrete energy levels is called quantum confinement. Under these conditions, the semiconductor material ceases to resemble bulk and instead is called a quantum dot. This has large repercussions on the absorptive and emissive behavior of the semiconductor material and thus on the applications quantum dots can be used for. With quantum dots, the size of the bandgap of the material may be controlled simply by adjusting the size of the dot. Because the emission frequency of a dot is dependent on the bandgap, it is therefore possible to control the output wavelength of a dot with extreme precision.

Although quantum dots have many promising applications, such as their use in lasers, single electron transistors or others, it is not always easy to control the size of quantum dots and/or their precise location on the substrate. Up till now, quantum dots are formed by using electron beam (e-beam) lithography techniques. These lithography techniques use a focused beam of electrons to expose a resist. In these techniques no mask is used as the pattern is "written" directly into the resist by very fast scanning of the electron beam. With this technique a pattern transfer resolution of below 100 nm may be obtained. However, the resolution is limited by the proximity effect, i.e. by scattering of electrons in the irradiated resist. This proximity effect may be responsible for the size of the exposed resist area being larger than the diameter of the incident electron beam which thus limits the resolution of e-beam lithography. This may be a disadvantage when using e-beam lithography for forming quantum dots as the size of the quantum dot determines its properties. Another disadvantage of using e-beam lithography for making quantum dots is that it is not suitable for being used for mass production of devices comprising quantum dots because of this proximity effect.

SUMMARY OF CERTAIN INVENTIVE ASPECTS

Certain inventive aspects relate to a method for forming at least one quantum dot on a predetermined location on a substrate, a design for a lithographic mask for use with the method according to embodiments of the present invention and a method for making such a design.

With the method according to one inventive aspect, the formation of quantum dots can be well controlled with respect to size and location which can be very important in, for example, the manufacturing process of semiconductor devices.

The method is CMOS compatible and can be used for mass production.

The method can be used in manufacturing processes of, for example, single electron transistors or lasers, or for growing nanostructures, such as nanowires or nanotubes, on.

One inventive aspect relates to a method for forming at least one quantum dot at least one predetermined location on a substrate. The method comprises:

providing a layer of semiconductor material on an insulating layer on the substrate, patterning the layer of semiconductor material so as to provide at least one line of semiconductor material on the substrate, the at least one line having a width, and patterning the at least one line of semiconductor material so as to form the at least one quantum dot.

Patterning the layer of semiconductor material is performed such that the at least one line of semiconductor material has a local width variation at least one predetermined location where the at least one quantum dot has to be formed, the local width variation having an amplitude of between about 20 nm and 35 nm higher than the width of the at least one line.

In one aspect, quantum dots can be formed at well defined, predetermined locations on a substrate. The quantum dots formed may have a diameter of between about 10 n and 75 nm, or between about 25 nm and 50 nm, which is up to twice to four times smaller than the diameter that can be obtained for quantum dots formed by prior art techniques such as, for example, e-beam lithography.

The local width variation may have an amplitude of between about 25 nm and 30 nm higher than the width of the at least one line.

Patterning the at least one line of semiconductor material so as to form the at least one quantum dot may be performed by a hydrogen anneal at temperatures of between about 600° C. and 950° C. and at a pressure of between about 1 Torr and 760 Torr.

For example, the hydrogen anneal may be performed at a temperature of about 840° C.

For example, the hydrogen anneal may be performed at a pressure of about 40 Torr.

The hydrogen anneal may be performed during a time period of between about 70 second and 600 seconds.

For example, the hydrogen anneal may be performed during a time period of about 85 seconds.

The method may further comprise, after patterning the layer of semiconductor material, cleaning the substrate. This may be done to obtain a hydrophobic substrate surface with no contamination such as native oxides. A hydrophobic substrate surface may increase efficiency of reflow of the semiconductor material to form quantum dots.

The method may furthermore comprise, before patterning the layer of semiconductor material, providing an antireflective coating onto the layer of semiconductor material.

A further aspect relates to the use of the method in the manufacturing process of a single electron transistor.

A further aspect relates to the use of the method in the manufacturing process of a laser.

A further aspect relates to the use of the method in the formation of nanowires.

Another aspect relates to a semiconductor device comprising at least quantum dot formed by the method. The semiconductor device may, for example, be a single electron transistor or a laser.

Another inventive aspect relates to a design for a lithographic mask, the design being adapted for generating a pattern on a substrate, the pattern comprising at least one line, the at least one line having a width and having a local width variation at least one predetermined location, the local width variation having an amplitude of between about 20 nm and 35 nm higher than the width of the at least one line.

The design may be the same as the pattern to be generated on the substrate.

According to other embodiments, the design may be the inverse of the pattern to be generated on the substrate.

Another aspect relates to a method for manufacturing a lithographic mask, the lithographic mask comprising a pattern to be printed on a substrate according to a design.

Another aspect relates to a lithographic mask comprising a pattern to be printed on a substrate.

Another inventive aspect relates to a method for making a design, the design being adapted for generating a predetermined pattern on a substrate, the pattern comprising at least one line, the at least one line having a width and having a local width variation at least one predetermined location, the local width variation having an amplitude of between about 20 nm and 35 nm higher than the width of the at least one line. The method comprises:
  a) providing a design,
  b) simulating the method for forming at least one quantum dot at least one predetermined location on a substrate according to one aspect, and
  c) adapting the design for obtaining the predetermined pattern on the substrate.
  d) The method may furthermore comprise repeating steps b and c at least once.

Another aspect relates to a computer program product for performing, when executed on a computing means, a method for making a design according to one aspect.

Another aspect relates to a machine readable data storage device for storing the above computer program product.

Another aspect relates to transmission of the above computer program product over a local or wide area telecommunications network.

In another aspect, a method of forming a quantum dot on a substrate is disclosed. The method comprises providing a layer of semiconductor material on an insulating layer on a substrate. The method further comprises patterning the layer of semiconductor material so as to provide at least one line of semiconductor material having a width (wL) on the substrate, the at least one line having a local width variation at a predetermined location, the local width variation having an amplitude (A) of between about 20 nm and 35 nm higher than the width (wL) of the at least one line. The method further comprises patterning the line of semiconductor material by hydrogen anneal so as to form a quantum dot at the predetermined location on the substrate.

In another aspect, a method of making a design is disclosed, wherein the design is adapted for generating a predetermined pattern on a substrate, the pattern comprising at least one line, the at least one line having a width (wL) and having a local width variation at least one predetermined location, the local width variation having an amplitude (A) of between about 20 nm and 35 nm higher than the width (wL) of the at least one line. The method comprises providing a design, simulating a method as described above for forming at least one quantum dot at least one predetermined location on a substrate, and adapting the design for obtaining the predetermined pattern on the substrate.

In another aspect, a method of forming a quantum dot on a substrate is disclosed. The method comprises providing a layer of semiconductor material on an insulating layer on a substrate, patterning the layer of semiconductor material so as to provide at least one line of semiconductor material on the substrate, and patterning the line of semiconductor material so as to form a quantum dot at the predetermined location on the substrate.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION OF CERTAIN INVENTIVE EMBODIMENTS

Figure 1:
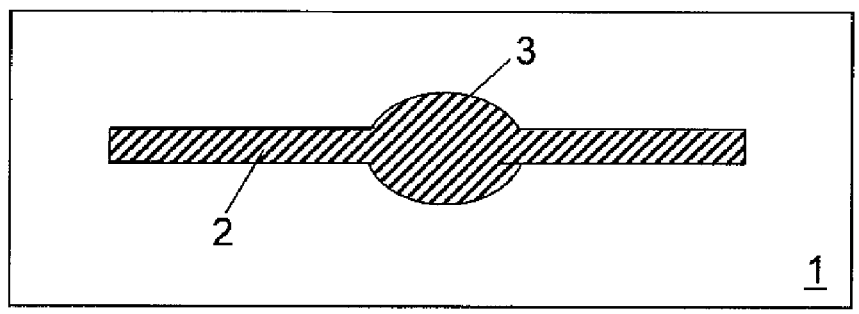
FIG. 1 to FIG. 3 show the method according to embodiments of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Certain embodiments relate to a method for forming at least one quantum dot at least one predetermined location on a substrate. The method comprises:

providing a layer of semiconductor material on an insulating layer on the substrate, patterning a layer of semiconductor material so as to provide at least one line of semiconductor material, the at least one line having a width $w_L$, and patterning the at least one line of semiconductor material so as to form the at least one quantum dot.

Patterning the layer of semiconductor material is performed such that the at least one line of semiconductor material has a local width variation at least one predetermined location where the at least one quantum dot has to be formed, the local width variation having an amplitude A of between about 20 nm and 35 nm higher than the width $w_L$ of the at least one line, the amplitude being defined as the maximum width of the line at the local width variation. According to embodiments of the present invention, the amplitude A may be between about 25 nm and 30 nm higher than the width $w_L$ of the at least one line.

With the method according to embodiments of the present invention it is possible to form quantum dots at predetermined locations on a substrate and with a diameter of between about 10 nm and 75 nm, or between about 25 nm and 50 nm, which is up to twice to four times smaller than quantum dots obtainable by using prior art methods such as e-beam lithography. With the method according to embodiments of the invention, the formation of quantum dots can be well controlled with respect to size and location. This can be important in, for example, the manufacturing process of semiconductor devices. The method according to embodiments of the invention can be used in manufacturing processes of, for example, single electron transistors or lasers, or for growing nanostructures, such as nanowires or nanotubes, on.

Hereinafter, the method will, for clarity purposes, be described by means of one quantum dot. It has to be understood that this is not intended to limit the invention in any way and that the method according to embodiments of the invention can also be used for forming any number of quantum dots required for a certain application.

In a first process of the method according to embodiments of the present invention, a substrate 1 is provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer.

Onto the substrate 1, an insulating layer such as an oxide layer is provided (not shown in the figures). The insulating layer such as an oxide layer may have a thickness of between about 100 nm and 200 nm and may, for example, have at thickness of about 150 nm. However, according to other embodiments, the insulating layer may have any other suitable thickness. According to embodiments of the invention, the substrate 1 may be a semiconductor-on-insulator substrate and may, for example be a silicon-on-insulator (SOI) substrate. On top of the insulating layer such as an oxide layer, a layer of semiconductor material is provided. The semiconductor material may be any suitable semiconductor material for forming quantum dots. Preferably, the semiconductor material may be silicon. According to other embodiments of the invention, the semiconductor material may, for example, be Ge, SiGe, SiC, SiGeC or GeC. According to embodiments of the invention, the semiconductor material may be crystalline. The layer of semiconductor material may have a thickness of between about 50 nm and 200 nm, of between about 50 nm and 100 nm and may, for example, be about 70 nm.

Figure 2:
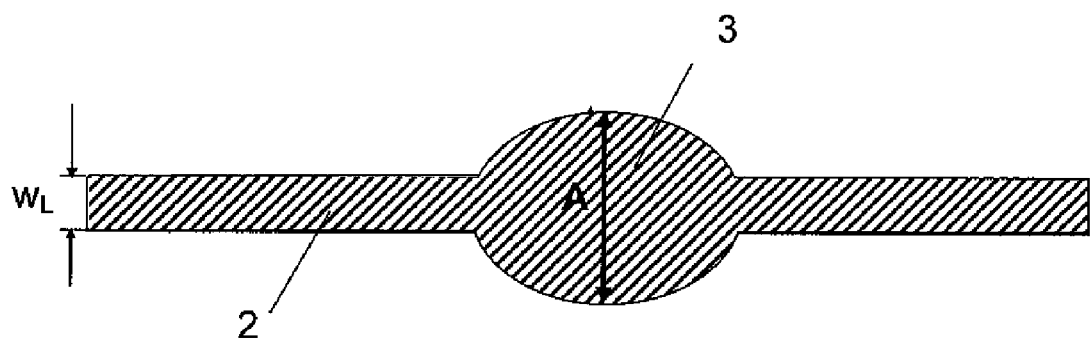

Next, the layer of semiconductor material is patterned to form at least one line 2 of semiconductor material. This is illustrated in FIG. 1 which shows a top view of the substrate 1 with the at least one line 2 on top of it. The at least one line 2 of semiconductor material may have a width $w_L$ (see FIG. 2) of between about 5 nm and 50 nm, between about 5 nm and 25 nm or between about 10 nm and 25 nm. The layer of semiconductor material is patterned such that at least one line 2 of semiconductor material comprises at least one local width variation 3 at least one predetermined location. The predetermined location is the location where the at least one quantum dot has to be formed. The at least one local width variation has an amplitude A (see FIG. 2) of between about 20 nm and 35 nm. For example, the at least one local width variation may have an amplitude of between about 25 nm and 35 nm or between about 25 nm and 30 nm higher than the width $w_L$ of the at least one line 2. The local width variation 3 may also be referred to as a local broadening of the line 2, as a wobble or as a bulge. The amplitude A of the local width variation is defined as the maximum thickness of the wobble or, in other words, as the maximum width of the line 2 at the location of the local width variation 3, as indicated in FIG. 2.

According to embodiments of the invention, patterning the layer of semiconductor material to form the at least one line 2 having a local width variation 3 may be performed by using a lithographic mask. The design of the lithographic mask may be adapted for generating a pattern on the substrate 1, the pattern comprising at least one line 2, the at least one line 2 having a width $w_L$ and having a local width variation 3 at least one predetermined location, the local width variation 3 having an amplitude of between about 20 nm and 35 nm, or between about 25 nm and 35 nm or between about 25 nm and 30 nm higher than the width $w_L$ of the at least one line 2. According to embodiments of the invention, the design may be such that it is the same as the pattern to be printed on the substrate 1. In this case, a positive photoresist may be used, as known by a person skilled in the art. According to other embodiments of the invention, the design may be such that it is the inverse of the pattern to be printed on the substrate 1. In that case, a negative photoresist may be used, as known by a person skilled in the art.

The design may be made based on simulated values. The simulation may comprise an optical simulation, an etch simulation, or a simulation of the semiconductor material reflow (see further). The design may be adapted in an iterative manner such that after simulation it has a predetermined, desired shape and is suitable to be used to provide at least one quantum dot at a predetermined location on a substrate 1.

By patterning the layer of semiconductor material, part of the insulating layer, e.g. oxide layer, will be exposed.

After patterning the layer of semiconductor material, to obtain the structure as shown in FIG. 1, the substrate 1 may preferably be cleaned. This may be done by first performing a cleaning process in a basic solution, e.g. in a mixture of $NH_4OH$ and $H_2O_2$ for between about 50 seconds and 100 seconds followed by a cleaning process in an acid solution, e.g. in a HF solution, for between about 50 seconds and 100 seconds. The duration of the cleaning process may depend on the concentration of the acid solution, e.g. HF solution. For example, for a 0.7% HF solution the cleaning process may take about 75 seconds. The time duration of the cleaning process may preferably be such that reactive dangling bonds exposed at a surface of the substrate 1 after removal of the contaminants, such as native oxides or residues, become passivated by hydrogen of the acid solution, e.g. HF solution, thereby forming a hydrophobic surface for preventing re-oxidation to occur at the surface during transport of the substrate 1 to a tool where formation of the at least one quantum dot will be performed. Obtaining a hydrophobic substrate surface without contaminants may be important in order to get a controlled reflow of the semiconductor material, e.g. Si, so as to form good quantum dots.

After cleaning the substrate 1, preferably all contaminants, such as e.g. native oxides or residues at the Si surface, e.g. oxide layer, are removed from the substrate 1 and from the patterned semiconductor material. Any native oxide remaining on the surface of the substrate 1 may block or disturb reflow of the semiconductor material in the process of forming the at least one quantum dot. For example, native oxide islands present at the surface of the substrate 1 may prevent uniform reflow of the patterned Si.

In a next process, quantum dots are formed by further patterning the at least one patterned line 2. This may be performed by performing a $H_2$ (hydrogen) anneal at temperatures between about 600° C. and 950° C., for example between about 800° C. and 850° C., for example at about 840° C. and at a pressure of between about 1 Torr and 760 Torr (=1 atm), for example between about 35 Torr and 45 Torr, e.g. at 40 Torr.

The $H_2$ anneal may be performed during a time period of between about 70 second and 600 seconds, and may, for example, be performed during about 85 seconds. The $H_2$ anneal may be done in pure $H_2$. With pure $H_2$ is meant that the $H_2$ gas comprises a $H_2O$ and/or $O_2$ background of less than about 100 ppb at 1 atm or 760 Torr. $H_2$ may flow over the surface of the substrate 1 in a laminar way at a few cm/sec, for example at about 5 cm/sec, depending on the flow and tool size. The direction of the $H_2$ flow with respect to the surface of the substrate is not important.

The low $H_2O$ and $O_2$ backgrounds in the $H_2$ ambient may be of use. At for example, about 700° C., the moisture partial pressure in the tool may preferably be below about $1.10^{-8}$ Torr, otherwise, when the $H_2O$ and $O_2$ backgrounds in the $H_2$ ambient gets too high, oxidation of the surface of the substrate 1 may occur from the ambient. The oxidation rate is proportional to the moisture and oxygen pressure. The oxidation rate should not exceed the oxide removal rate, otherwise a net oxidation of the surface will occur. For example, at about 850° C., a moisture partial pressure of about $1.10^{-6}$ Torr can be tolerated. As mentioned before, an oxidized substrate surface may prevent reflow of the semiconductor material from occurring or may, if reflow of the semiconductor material occurs, play a disturbing role. Also partial re-oxidation of the surface of the substrate 1 may, as already mentioned above, prevent a uniform reflow of the semiconductor material or, in other words, disturb the reflow of the semiconductor material.

The basic physical mechanism behind reflow of the semiconductor material is a minimization of the substrate surface energy, or in other words the semiconductor structures on the insulating layer, e.g. oxide layer, will change shape so as to minimize their surface area. Surface mobility of the semiconductor material may in the method according to embodiments of the invention, result from the following main effects:

(a) A first effect is temperature driven surface mobility of the semiconductor material. Surface diffusion of the semiconductor material depends on factors such as initial surface roughness and the amount of H passivating dangling bonds at the substrate surface, also referred to as H-coverage. At temperatures above 700° C., this H-coverage should be very low. At lower temperatures however, this H-coverage is significant and will reduce mobility of the semiconductor material. The H-coverage at a given temperature depends on the total pressure of the $H_2$-ambient; the higher the pressure is, the lower the mobility will be.

(b) As a second effect, mobility of the semiconductor material also results from interaction with the ambient. $H_2$ can react with semiconductor material to form volatile semiconductor-H species. Some of these species get carried away in the main stream (etching), others are immediately re-deposited. This etch and re-deposition processes create mobility of the semiconductor material over larger distances than just surface diffusion. This may explain to some extent the strong pressure dependence of semiconductor material reflow that has been observed at higher temperatures. Lower pressures means longer mean free paths because there are less atoms that can interfere. After desorbing from the substrate surface, a semiconductor-H species has a higher chance of getting permanently removed by the carrier stream at low pressures compared to high pressures due to this longer mean free path.

Another reason why migration or reflow of the semiconductor material occurs may be because of the following reaction, which in case of Si and a $SiO_2$ in between the Si and the substrate 1 may be:

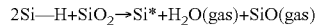

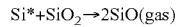

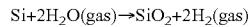

Because of the above reaction which occurs at the $Si/SiO_2$ interface, free Si* can migrate or reflow. It can be seen that because of this reaction, oxygen present in the neighborhood of the semiconductor material, i.e. native oxides present on the substrate surface or residues of the insulating layer, as described above, may be kept as low as possible in order to make the reaction happen at the $Si/SiO_2$ interface. An increase of the oxide concentration may drive back the reaction or may even prevent this reaction. The time period during which annealing is performed must be controlled to prevent complete release of the quantum dots.

From the above it is clear that process parameters such as temperature, pressure and time have to be carefully chosen so that quantum dot formation is optimized. With optimized is meant that good quantum dots are formed. Therefore, temperature, pressure at time at which the $H_2$ anneal is performed may be tuned to each other. Suitable, though not limiting, examples may be a $H_2$ anneal at a temperature of about 840° C. and a pressure of about 40 Torr or a $H_2$ anneal at a temperature of about 750° C. and a pressure of about 10 Torr.

A decrease of pressure and/or increase of temperature and/or time may have a two-fold effect:
1. It may give rise to acceleration of the reaction described above.
2. It may influence the distance over which this reaction occurs. The reaction at the $Si/SiO_2$ interface together with the distance over which Si migrates may determine the size of the quantum dots 4 formed.

It has to be understood that the above-described $H_2$ anneal performed to form the quantum dot 4 is only an example. Any suitable technique known by a person skilled in the art and which causes reflow of the semiconductor material required to form a quantum dot 4 may be used. For example, besides a $H_2$ ambient, any other oxygen free ambient, such as, for example, an $N_2$ ambient, may be used to further pattern the at least one line 2 to form a quantum dot 4.

Figure 3:
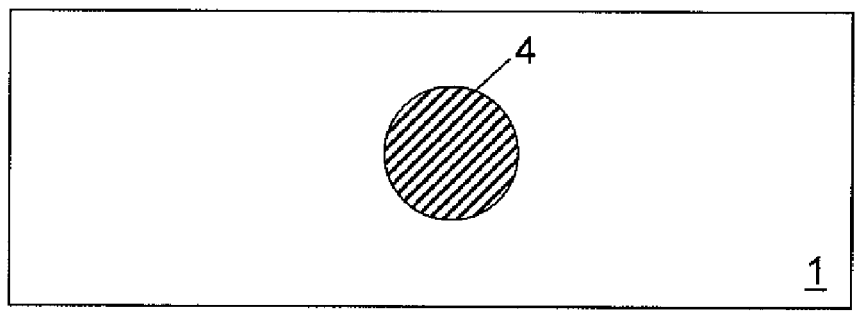

After the $H_2$ anneal quantum dots 4 are formed (see FIG. 3) at the locations where the lines 2 of semiconductor material showed the local width variation 3 because the at least one line 2 becomes thinner and thinner and the semiconductor material at the locations with local width variation 3 becomes smoother because of corner rounding. Corner rounding is also a consequence of the $H_2$ anneal. The mechanism behind corner rounding is also minimization of the surface energy of the semiconductor material. Minimization of the surface energy will lead to rounding of the corners of the semiconductor material structures on the substrate 1 and will, together with the reflow of the semiconductor material as described above make sure that a quantum dot is formed and the line 2 disappears. The size of the quantum dots 4 formed depends on the amplitude A of the local width variations 3 of the at least one line 2 of semiconductor material.

The quantum dots 4 may have a substantially spherical shape. Due to a large gradient of curvature changes at corners, atoms of the patterned semiconductor material may migrate rapidly from corners of the pattered structures to their sidewalls. As long as the width and length of the patterned semiconductor material, i.e. of the local width variation 3, is smaller or equal to the corner radius, the patterned semiconductor material may be transformed to a quantum dot 4.

Figure 4:
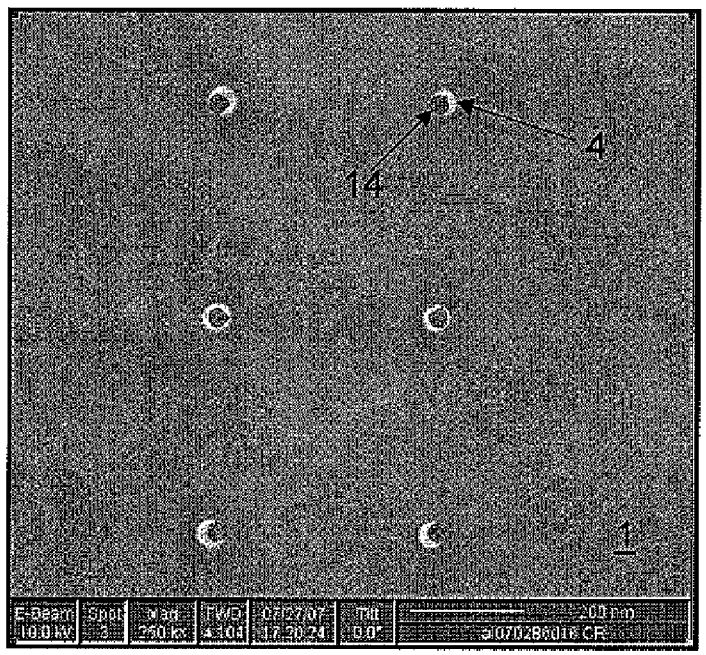
FIG. 4 and FIG. 5 show examples of quantum dot with different shapes formed by the method according to embodiments of the invention.
Figure 5:
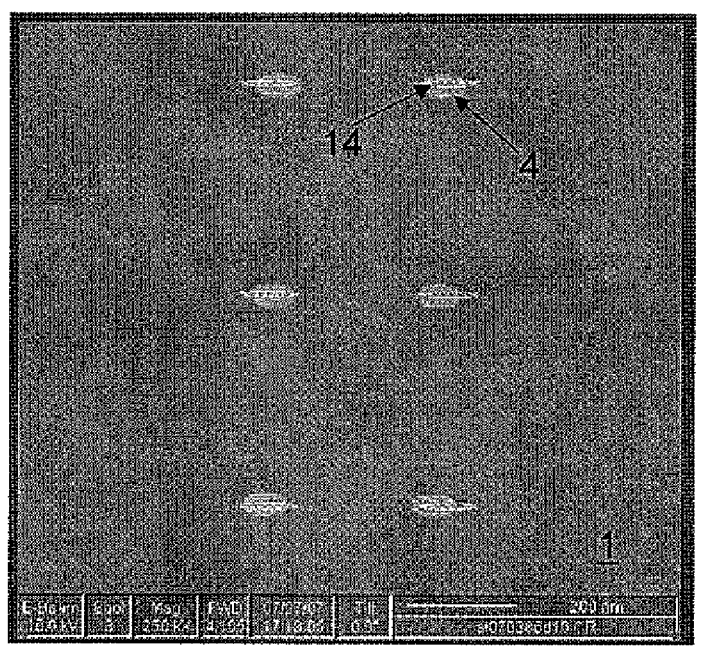

However, according to other embodiments of the invention, the quantum dots 4 may also have different shapes, such as a substantially elliptical shape. FIGS. 4 and 5 respectively show substantially spherical shaped and substantially elliptical shaped quantum dots. The quantum dots indicated with reference number 4 are the ones who have been formed by the method according to embodiments of the present invention. The quantum dots indicated with reference number 14 are the predicted ones, i.e. the simulated ones. As can be seen from FIGS. 4 and 5, the quantum dots 4 formed by the method according to embodiments of the invention are substantially coinciding with the predicted or simulated, and thus desired locations.

Depending on the process parameters of the $H_2$ anneal, on the width $w_L$ of the at least one line 2 of semiconductor material and on the amplitude A of the at least one local width variation 3, free-standing quantum dots 4 (see FIGS. 3, 4 and 5) can be obtained or quantum dots 4 can be obtained which are still connected to the line 2 of semiconductor material. In the latter case, the line 2 of semiconductor material may be very small, i.e. may have a thickness of only a few nm. Such structures, in which the at least one quantum dot 4 is still connected to the line 2 of semiconductor material may be suitable for forming a single electron transistor (see further).

Hence, by tuning the design of the lithographical mask used to pattern the layer of semiconductor material and by tuning the process parameters of the $H_2$ anneal, different quantum dot structures can be obtained. Hence, the method according to embodiments of the invention can be used in different applications. For example, the method according to embodiments of the invention may be used in the manufacturing process of single electron transistors, in the manufacturing process of a laser or in the growth of nanostructures such as nanowires or nanotubes.

An advantage of the method according to embodiments of the invention is that local width variations 3 can be provided at well determined locations on a substrate 1 and hence quantum dots 4 can be provided at well determined locations on that substrate 1.

The amplitude A of the local width variation 3, together with process parameters of the patterning process, e.g. $H_2$ anneal, for quantum dot formation as described above, should be carefully chosen. If this amplitude A of the local width variation 3 is too small, semiconductor material of the line 2 at the predetermined locations with local width variation 3 will be consumed during subsequent patterning. Hence, in this case no quantum dots 4 will be formed as all semiconductor material will have disappeared after patterning. On the other hand, if the amplitude A of the local width variation 3 is too high, or is much higher than the width $w_L$ of the at least one line 2 of semiconductor material, a flow of semiconductor material will occur from the locations with local width variation 3 towards the other parts of the line 2 and again, no quantum dots 4 will be formed, as no separation will occur because the line 2 will remain too thick, even for being used for single electron transistors. With separation is meant that during patterning of the at least one line 2 of semiconductor material, the line 2 becomes so small that a connection between the line 2 and location with the local width variation 3 is interrupted. For example, for being suitable for use with a single electron transistor, experiments have shown that the dimensions of the line 2 may be such that the line 2 has a resistance of more than about 25813 Ohm, and that it still allows electron tunneling.

By using the method according to embodiments of the present invention, quantum dots 4 can be formed on the substrate 1 at locations substantially equal to the predetermined or simulated locations, as was described with respect to FIGS. 4 and 5.

Figure 6:
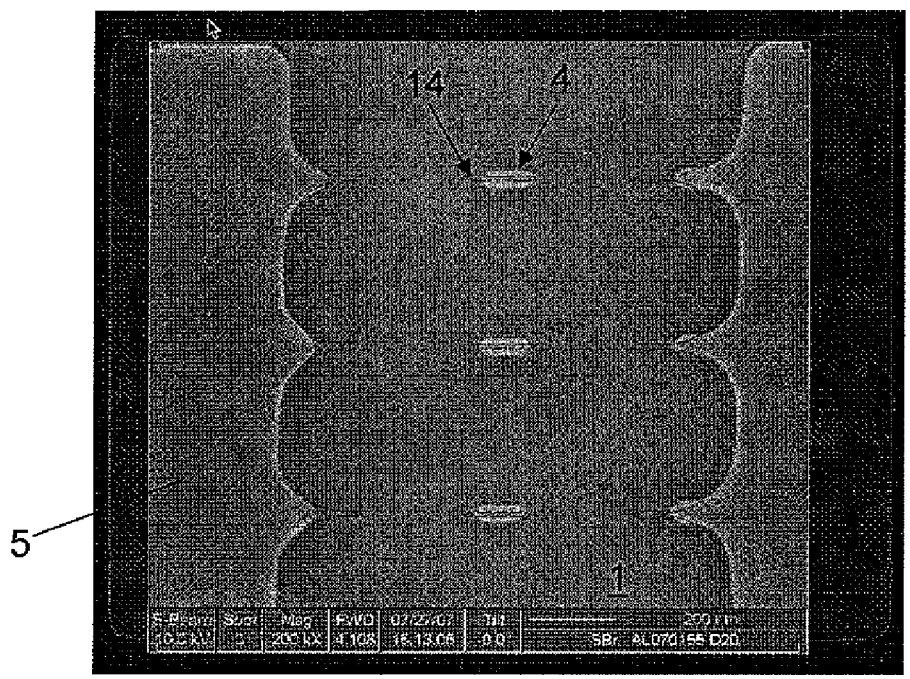
FIG. 6 and FIG. 7 show examples of structures obtained by the method according to embodiments of the invention.
Figure 7:
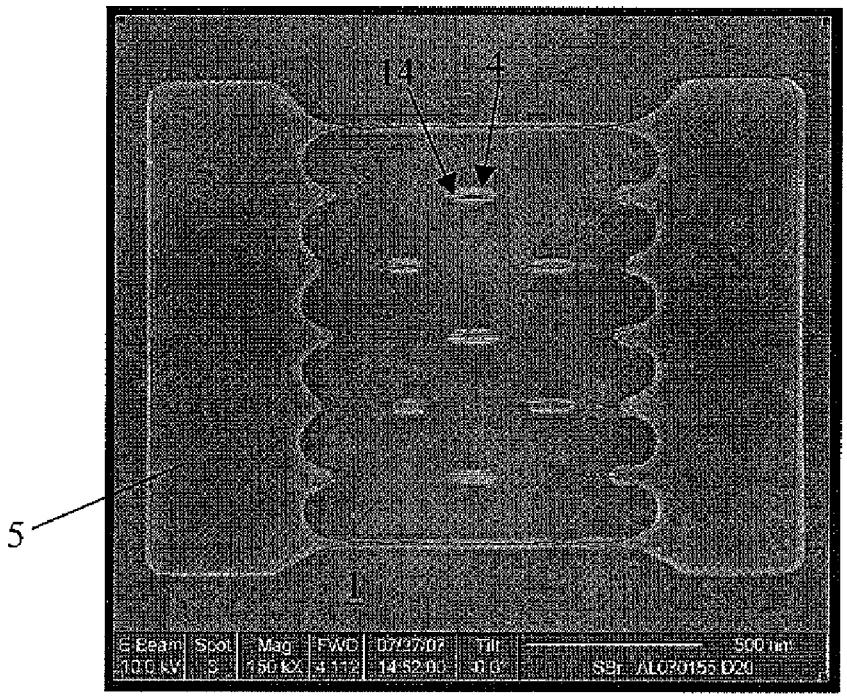

The method according to embodiments of the invention can be used to form any number of quantum dots 4 on a substrate 1. For example, the method may be used to form one row comprising any number of quantum dots 4 or may be used to form a plurality of rows comprising any number of quantum dots 4. When a plurality of rows of quantum dots 4 are formed, any row may comprise a same number of quantum dots 4 (see FIG. 6) or a different number of quantum dots 4 (see FIG. 7) than the other rows. In FIG. 6 and FIG. 7 the lines 2 of semiconductor material are located in between side portions 5. Again, in these figures, the quantum dots indicated with reference number 14 are the predicted ones, i.e. the simulated ones and the quantum dots indicated with reference number 4 are the quantum dots formed by the method according to embodiments of the invention. As can be seen from FIG. 6 and FIG. 7, the quantum dots 4 formed by the method according to embodiments of the invention are substantially coinciding with the predicted or simulated, and thus desired locations.

The method according to embodiments of the invention is CMOS compatible and can be used for mass production, because the method relies on a particular way of patterning a semiconductor layer. Once the pattern is determined, processing may continue using standard CMOS processes. Furthermore, the method according to embodiments of the invention can be used to form single electron circuits (see further).

Hereinafter, some applications of the method according to embodiments of the invention will be described. It has to be understood that this is only for the purpose of illustration and is not intended to limit the invention in any way.

Figure 8:
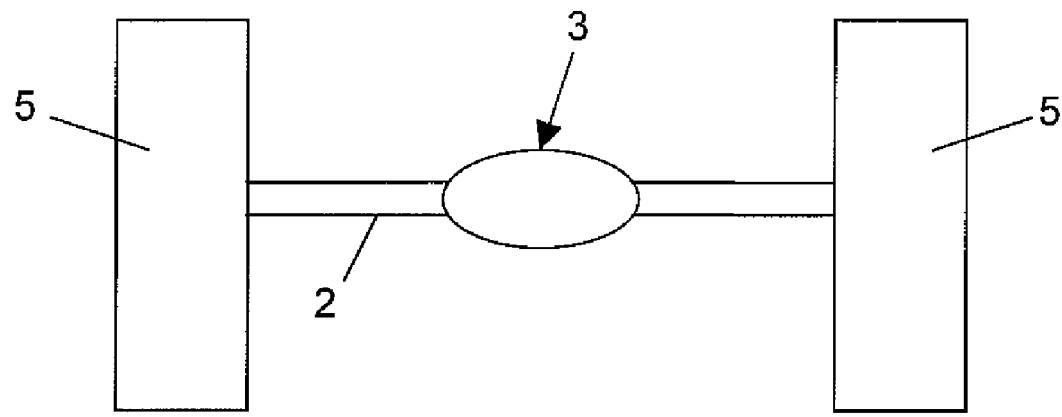
FIG. 8 and FIG. 9 schematically illustrate the manufacturing of a single electron transistor using the method according to embodiments of the invention.
Figure 9:
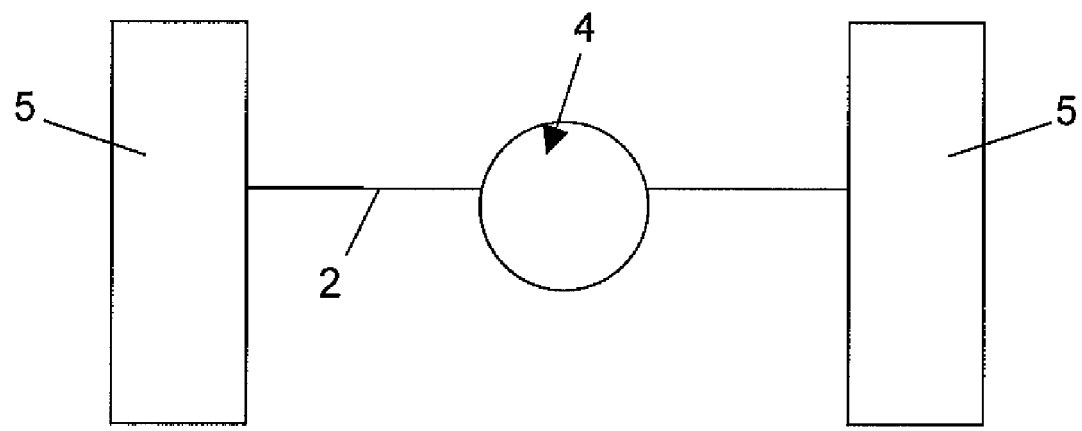

In a first application, the method according to embodiments of the invention may be used in the manufacturing process of a single electron transistor. This is schematically illustrated in FIG. 8 and FIG. 9. For this application, after patterning the layer of semiconductor material, a structure is formed as illustrated in FIG. 8. The structure comprises two side portions 5, also referred to as source/drain electrodes, with in between a line 2 having a local width variation 3 at a predetermined location where a quantum dot 4 is to be formed. During a $H_2$ anneal performed to form the quantum dot 4, the process parameters are tuned such that the quantum dot 4 formed is still connected with the line 2 (see FIG. 9 (schematically)). According to the present example, the width of the remaining line 2 has to be such that it forms a tunneling junction between each of the source/drain electrodes 5 and the quantum dot 4. The width of the line 2 is related to the capacitance of the quantum dot 4. For being suitable for being used as single electron transistor, the line 2 must become very thin, i.e. the line 2 may have a thickness of only a few nm. The tunneling resistance of the line 2 may be more than $h/e^2=25813$ Ohm (with h being Planck's constant and e being the charge of the electron). Because of this, the structure as illustrated in FIG. 9 can function as a double tunnel junction device. Adding a gate on top of the quantum dot 4 (not shown in the figure) may form a single electron transistor. The gate can be formed by using any suitable technique as known by a person skilled in the art. The thickness of the line 2 may be so small that, when an electron is transferred from the left side portion 5, acting as a source, to the quantum dot 4, no other electrons can be transferred to the quantum dot 4 before the electron has been transferred to the second, right side portion 5. The transfer of one electron from the source to quantum dot 4 induces a charging energy equal to $e^2/2C$, where C is the total capacitance of the quantum dot 4. As a result, tunneling is inhibited until the combined source/drain and gate bias have overcome the charging energy.

In another application, free-standing quantum dots 4 are formed. This can be done by, as already described above, tuning the width $w_L$ of the at least one line 2 of semiconductor material, by tuning the amplitude A of local width variations 3 and/or by tuning the process parameters of the patterning process, e.g. $H_2$ anneal process for quantum dot formation. These free-standing quantum dots 4 may, in this case, be formed of silicon and may then be silicidized, as known by a person skilled in the art. The silicidized quantum dots 4 can then be used to grow nanostructures, such as e.g. nanowires or nanotubes, on. The nanowires or nanotubes can then be used to contact the quantum dots 4.

In the above described applications, the quantum dots 4 are formed to really be used as a quantum dot, i.e. to use the properties of a quantum dot. Therefore, in these cases the quantum dots 4 may have a substantially spherical shape. In that case, confinement equally occurs in three directions. In elliptical shaped quantum dots, on the contrary, confinement will be larger in one direction than in the others, which may not be advantageously for particular applications. However, elliptical shaped quantum dots may, for example, be used in lasers.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of forming a quantum dot on a substrate, the method comprising:
    providing a layer of semiconductor material on an insulating layer on a substrate;
    patterning the layer of semiconductor material so as to provide at least one line of semiconductor material having a width (wL) on the substrate, the at least one line having a local width variation at a predetermined location, the local width variation having an amplitude (A) of between about 20 nm and 35 nm higher than the width ($w_L$) of the at least one line; and
    patterning the line of semiconductor material by hydrogen anneal so as to form a quantum dot at the predetermined location on the substrate.

2. The method according to claim 1, wherein the formed quantum dot is a free-standing quantum dot.

3. The method according to claim 1, wherein the hydrogen anneal is performed at a temperature between about 500° C. and 900° C. and at a pressure between about 1 Torr and 760 Torr.

4. The method according to claim 1, wherein the local width variation has an amplitude (A) of between about 25 nm and 30 nm higher than the width ($w_L$) of the at least one line.

5. The method according to claim 1, wherein the hydrogen anneal is performed for a duration of between about 70 second and 200 seconds.

6. The method according to claim 1, wherein the hydrogen anneal is performed at a temperature of about 840° C.

7. The method according to claim 1, wherein the hydrogen anneal is performed at a pressure of about 40 Torr.

8. The method according to claim 1, wherein the hydrogen anneal is performed for a duration of about 85 seconds.

9. The method according to claim 1, further comprising, after patterning the layer of semiconductor material, cleaning the substrate.

10. The method according to claim 1, further comprising, before patterning the layer of semiconductor material, providing an antireflective coating onto the layer of semiconductor material.

11. A method of manufacturing a single electron transistor comprising the method according to claim 1.

12. A method of manufacturing a laser comprising the method according to claim 2.

13. A method of forming nanowires comprising the method according to claim 2.

* * * * *